(12) United States Patent
 Chen et al.

(10) Patent No.: US 11,112,897 B2
(45) Date of Patent: Sep. 7, 2021

(54) ORGANIC LIGHT-EMITTING DISPLAY PANEL AND PREPARATION METHOD THEREOF, AND DISPLAY DEVICE

(71) Applicant: BOE Technology Group Co., Ltd., Beijing (CN)

(72) Inventors: Liang Chen, Beijing (CN); Lei Wang, Beijing (CN); Detao Zhao, Beijing (CN); Huijuan Wang, Beijing (CN); Xiaochuan Chen, Beijing (CN); Minghua Xuan, Beijing (CN); Shengji Yang, Beijing (CN); Li Xiao, Beijing (CN); Dongni Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/622,412

(22) PCT Filed: May 15, 2019

(86) PCT No.: PCT/CN2019/087089
§ 371 (c)(1),
(2) Date: Dec. 13, 2019

(87) PCT Pub. No.: WO2019/223588
PCT Pub. Date: Nov. 28, 2019

(65) Prior Publication Data
US 2020/0201466 A1 Jun. 25, 2020

(30) Foreign Application Priority Data

May 24, 2018 (CN) .......................... 201810509975.5

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0443* (2019.05); *H01L 27/323* (2013.01);
(Continued)

(58) Field of Classification Search
None
See application file for complete search history.

(56) References Cited

U.S. PATENT DOCUMENTS

2009/0315855 A1 12/2009 Oikawa et al.
2012/0274202 A1 11/2012 Komatsu
(Continued)

FOREIGN PATENT DOCUMENTS

CN 101610633 A 12/2009
CN 103882374 A 6/2014
(Continued)

OTHER PUBLICATIONS

Mar. 24, 2020—(CN) First Office Action Appn 201810509975.5 with English Translation.

*Primary Examiner* — Steven M Christopher
(74) *Attorney, Agent, or Firm* — Banner & Witcoff, Ltd.

(57) ABSTRACT

A organic light-emitting display panel, a preparation method of the organic light-emitting display panel and a display device are provided. The preparation method of the organic light-emitting display panel includes: providing a base substrate; forming a plurality of touch electrode wirings, an organic functional layer, and a plurality of first electrodes sequentially on the base substrate, the plurality of the touch electrode wirings being electrically insulated from each other, the plurality of the first electrodes being electrically insulated from each other, and the plurality of the touch electrode wirings and the plurality of the first electrodes are in one-to-one correspondence, forming a first encapsulation structure on the plurality of the first electrodes, and then
(Continued)

using a laser irradiation process to electrically connect the respective first electrodes with the touch electrode wirings corresponding thereto by via holes passing through the organic functional layer.

10 Claims, 8 Drawing Sheets

(51) Int. Cl.
*H01L 27/32* (2006.01)
*H01L 51/52* (2006.01)

(52) U.S. Cl.
CPC ...... *H01L 27/3246* (2013.01); *H01L 27/3276* (2013.01); *H01L 51/5228* (2013.01); *H01L 51/5253* (2013.01); *G06F 2203/04103* (2013.01); *G06F 2203/04104* (2013.01); *H01L 2227/323* (2013.01)

(56) References Cited

U.S. PATENT DOCUMENTS

| | | | | |
|---|---|---|---|---|
| 2013/0203197 | A1* | 8/2013 | Tsai | .............. H01L 27/3279 438/35 |
| 2015/0255739 | A1* | 9/2015 | Kim | .............. H01L 27/3246 257/40 |
| 2016/0254452 | A1 | 9/2016 | Zhao et al. | |
| 2016/0328062 | A1 | 11/2016 | Jin | |
| 2017/0060302 | A1 | 3/2017 | Yang et al. | |
| 2018/0130857 | A1* | 5/2018 | Lee | ............. H01L 27/323 |

FOREIGN PATENT DOCUMENTS

| | | |
|---|---|---|
| CN | 104777637 A | 7/2015 |
| CN | 105094491 A | 11/2015 |
| CN | 105845708 A | 8/2016 |
| CN | 108550611 A | 9/2018 |

\* cited by examiner

ORGANIC LIGHT-EMITTING DISPLAY PANEL AND PREPARATION METHOD THEREOF, AND DISPLAY DEVICE

The application is a U.S. National Phase Entry of International Application No. PCT/CN2019/087089 filed on May 15, 2019, designating the United States of America and claiming priority to Chinese Patent Application No. 201810509975.5 filed on May 24, 2018. The present application claims priority to and the benefit of the above-identified applications and the above-identified applications are incorporated by reference herein in their entirety.

TECHNICAL FIELD

Embodiments of the present disclosure relate to an organic light-emitting display panel, a preparation method of the organic light-emitting display panel, and a display device.

BACKGROUND

An organic light-emitting diode (OLED) has advantages such as self-illumination, fast response, a wide viewing angle, high brightness, brilliant colors, lightness and thinness compared to a liquid crystal display device, and the organic light-emitting diode is considered to be the best choice for the next generation of display screen. A self-luminous element in the organic light-emitting diode is mainly composed of an anode, a light-emitting functional layer and a cathode which are arranged sequentially away from a base substrate.

For example, a touch layer is integrated into an OLED display panel, and at present, the common touch modes of OLED products are on-cell technology and in-cell technology. The on-cell technology is preparing a touch sensor element on an encapsulation structure. The in-cell technology is mainly divided into two types, respectively Hybrid IN CELL (HIC) and FULL IN CELL (FIC). The HIC is referred to as a "compound IN-CELL technology", and the HIC has two touch sensing layers: an upper touch sensing layer located on a surface of the encapsulation structure, and a lower touch sensing layer located on a common electrode of a thin film transistor, which is similar to a traditional ON-CELL display module. The FIC adopts a single-layer touch wiring design and a self-capacitance principle is used to realize multi-touch; and the FIC simplifies a structural design of the display module and reduces costs at a same time.

SUMMARY

At least one embodiment of the present disclosure provides a preparation method of an organic light-emitting display panel, and the method comprises: providing a base substrate; forming a plurality of touch electrode wirings, an organic functional layer, and a plurality of first electrodes sequentially on the base substrate, the plurality of the touch electrode wirings being electrically insulated from each other, the plurality of the first electrodes being electrically insulated from each other, and the plurality of the touch electrode wirings and the plurality of the first electrodes are in one-to-one correspondence; forming a first encapsulation structure on the plurality of the first electrodes, and then using a laser irradiation process to electrically connect the respective first electrodes with the touch electrode wirings corresponding thereto by via holes passing through the organic functional layer.

For example, in the preparation method provided by at least one embodiment of the present disclosure, after forming the plurality of the first electrodes, and before forming the first encapsulation structure, the method further comprises: forming a plurality of auxiliary electrodes which are spaced apart from each other on the plurality of the first electrodes, and the plurality of the auxiliary electrodes and the plurality of the first electrodes are in one-to-one correspondence; an orthographic projection of any one of the plurality of the auxiliary electrodes on the base substrate, an orthographic projection of the first electrode corresponding to the any one of the plurality of the auxiliary electrodes on the base substrate, and an orthographic projection of the touch electrode wiring corresponding to the any one of the plurality of the auxiliary electrodes on the base substrate have an overlapping region.

For example, in the preparation method provided by at least one embodiment of the present disclosure, the auxiliary electrodes are melted by the laser irradiation process and flow into the via holes in the organic functional layer to electrically connect the first electrodes with the touch electrode wirings corresponding thereto.

For example, the preparation method provided by at least one embodiment of the present disclosure, further comprises forming a second encapsulation structure on the first encapsulation structure.

For example, in the preparation method provided by at least one embodiment of the present disclosure, the second encapsulation structure comprises an inorganic encapsulation layer and an organic encapsulation layer which are sequentially stacked and alternately arranged.

For example, in the preparation method provided by at least one embodiment of the present disclosure, the laser irradiation process is used in a non-display region, such that the first electrodes are electrically connected with the touch electrode wirings corresponding thereto by the via holes passing through the organic functional layer.

For example, in the preparation method provided by at least one embodiment of the present disclosure, after forming the organic functional layer and before forming the plurality of the first electrodes, the method further comprises: forming a plurality of spacers on the organic functional layer, each of the plurality of the spacers having a longitudinal cross-section in a shape of inverted trapezoid.

For example, in the preparation method provided by at least one embodiment of the present disclosure, forming the plurality of the first electrodes being electrically insulated from each other comprises: forming a first electrode layer by an evaporation method, and the first electrode layer cracks at edges of the plurality of the spacers to form the plurality of the first electrodes being electrically insulated from each other.

For example, the preparation method provided by at least one embodiment of the present disclosure, further comprises: sequentially forming a driving circuit, a second electrode and a pixel definition layer on the base substrate, and the driving circuit comprises a gate electrode, a first source-drain electrode, and a second source-drain electrode; and the second electrode is electrically connected with the first source-drain electrode or the second source-drain electrode.

For example, in the preparation method provided by at least one embodiment of the present disclosure, the plurality of the touch electrode wirings are formed on a side of the pixel definition layer away from the base substrate.

For example, in the preparation method provided by at least one embodiment of the present disclosure, the plurality of the touch electrode wirings are formed in a same layer as the gate electrode, or, the plurality of the touch electrode wirings are formed in a same layer as the first source-drain electrode or the second source-drain electrode.

At least one embodiment of the present disclosure further provides an organic light-emitting display panel, and the organic light-emitting display panel comprises: a base substrate; a plurality of touch electrode wirings, an organic functional layer, a plurality of first electrodes and a first encapsulation structure which are arranged on the base substrate sequentially, the plurality of the touch electrode wirings being electrically insulated from each other, the plurality of the first electrodes being electrically insulated from each other; and the plurality of the touch electrode wirings are electrically connected with the plurality of the first electrodes in one-to-one correspondence by a plurality of via holes passing through the organic functional layer; the first encapsulation structure comprises a plurality of regions to be irradiated by laser, and the plurality of the regions to be irradiated by laser and the plurality of the via holes are in one-to-one correspondence.

For example, the organic light-emitting display panel provided by at least one embodiment of the present disclosure, further comprises: a plurality of auxiliary electrodes located between the plurality of the first electrodes and the first encapsulation structure and being in one-to-one correspondence with the plurality of the first electrodes; and an orthographic projection of any one of the plurality of the auxiliary electrodes on the base substrate, an orthographic projection of the first electrode corresponding to the any one of the plurality of the auxiliary electrodes on the base substrate, and an orthographic projection of the touch electrode wiring corresponding to the any one of the auxiliary electrodes on the base substrate have an overlapping region.

For example, in the organic light-emitting display panel provided by at least one embodiment of the present disclosure, the first encapsulation structure comprises a transparent inorganic insulating layer.

For example, the organic light-emitting display panel provided by at least one embodiment of the present disclosure, further comprises: a second encapsulation structure disposed on the first encapsulation structure, and the second encapsulation structure comprises an inorganic encapsulation layer and an organic encapsulation layer which are sequentially stacked and alternately arranged.

For example, the organic light-emitting display panel provided by at least one embodiment of the present disclosure, further comprises: a plurality of spacers disposed on the organic functional layer, each of the plurality of the spacers having a longitudinal cross-section in a shape of inverted trapezoid, and the plurality of the first electrodes are insulated from each other by the plurality of the spacers.

For example, the organic light-emitting display panel provided by at least one embodiment of the present disclosure, further comprises: a driving circuit, a second electrode and a pixel definition layer sequentially arranged on the base substrate, and the driving circuit comprises a gate electrode, a first source-drain electrode, and a second source-drain electrode; and the second electrode is electrically connected with the first source-drain electrode or the second source-drain electrode.

For example, in the organic light-emitting display panel provided by at least one embodiment of the present disclosure, the plurality of the touch electrode wirings are disposed on a side of the pixel definition layer away from the base substrate; or, the plurality of the touch electrode wirings are located in a same layer as the gate electrode, or, the plurality of the touch electrode wirings are located in a same layer as the first source-drain electrode or the second source-drain electrode.

At least one embodiment of the present disclosure further provides an organic light-emitting display panel formed by any one of the preparation methods mentioned above, and the organic light-emitting display panel comprises: a base substrate; a plurality of touch electrode wirings, an organic functional layer, a plurality of first electrodes and a first encapsulation structure which are sequentially disposed on the base substrate, the plurality of the touch electrode wirings being electrically insulated from each other, the plurality of the first electrodes being electrically insulated from each other, and the plurality of the touch electrode wirings are connected with the plurality of the first electrodes in one-to-one correspondence by a plurality of via holes passing through the organic functional layer.

At least one embodiment of the present disclosure further provides a display device, and the display device comprises any one of the organic light-emitting display panels mentioned above.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

Thicknesses and shapes of respective layers of thin films in the accompanying drawings of the embodiments of the present disclosure do not reflect true proportions of the organic light-emitting display panel, but are only intended to illustrate contents of the embodiments of the present disclosure.

In a display panel adopting an OLED FIC technology, the FIC adopts single-layer touch wiring design and a self-capacitance principle to realize multi-point touch. In order to avoid signal interference caused by integration of a display function and a touch function, the FIC adopts a "time sharing scanning" mode to divide unit time into two portions, one portion is used for touch scanning, and the other portion is used for display scanning; and the touch scanning and the display scanning do not interfere with each other, which fundamentally eliminates a hidden danger of signal interference.

Figure 1:
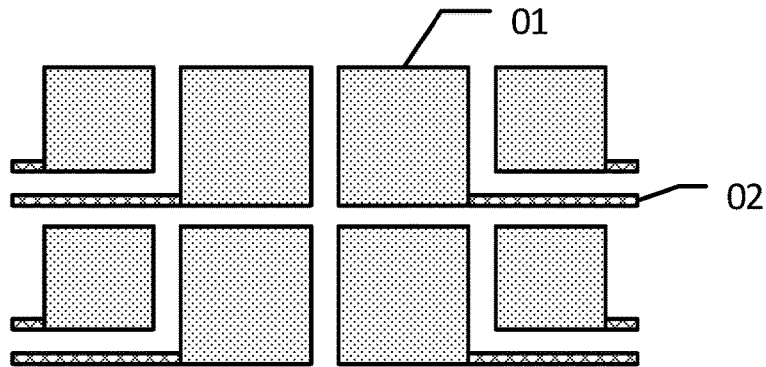
FIG. 1 is a planar structural schematic diagram of a cathode layer in an organic light-emitting display panel.

In a current arrangement mode of an embedded self-capacitive touch structure, a cathode is located at a top of an entire touch screen, and touch electrodes are formed by patterning the cathode, as well as dividing and multiplexing the cathode. The cathode is divided and multiplexed in a touch process and a display process, without preparing additional touch sensor electrodes, thereby the process is reduced. For example, FIG. 1 is a planar structural schematic diagram of a cathode layer in an organic light-emitting display panel. As illustrated in FIG. 1, cathodes 01 and touch electrode wirings 02 are provided at a same layer, and the cathodes 01 and the touch electrode wirings 02 are arranged in one-to-one correspondence. However, in a case that a size of a panel is increased, a wiring region (a touch blind region) being too large is in the structure, which influences the touch effect. Therefore, it is necessary to arrange the cathodes 01 and the touch electrode wirings 02 in different layers, and via hole structures are used to electrically connect the cathodes 01 with the touch electrode wirings 02, so as to realize a design of a large-sized in-cell OLED.

The via hole structures are usually formed by a photoetching process, however, the via hole structures need to pass through an organic functional layer, and performance of the organic functional layer is greatly affected by water and oxygen which are inevitably introduced by the photoetching process, so that the via hole structures should not be formed by a conventional photoetching process. Inventors of the present disclosure found that the via hole structures may be formed by the two modes of laser irradiation below. The first mode: firstly the organic functional layer is irradiated by laser, then a cathode thin film is evaporated on the organic functional layer provided with via hole structures to form cathodes, and the cathodes are electrically connect with the touch electrode wirings respectively, and finally an encapsulation structure is formed on the cathodes, since the organic functional layer is exposed to the outside, a large amount of impurity particles are generated in a laser irradiation process, and the impurity particles are distributed throughout the chamber; and since an exposed area of the organic functional layer is too large, the impurity particles easily enter the organic functional layer, to reduce purity of the organic functional layer, which finally affects the performance of the display panel. The second mode: after the encapsulation structure is formed, the laser irradiation process is used to form the via hole structures passing through the organic functional layer and melt the cathodes, so that the melting cathode material flows into the via hole structures to electrically connect the cathodes and the touch electrode wirings, and the encapsulation structure is made of a material having performances of light transmission and isolation of water and oxygen, so that the encapsulation structure does not absorb the laser energy and can not be carbonized, and the organic functional layer is not exposed to the outside, so there are few particles formed by carbonization of the organic functional layer during the laser irradiation, and the mode can avoid the decrease of the purity of the organic functional layer.

At least one embodiment of the present disclosure provides a preparation method of an organic light-emitting display panel, and the preparation method comprises: providing a base substrate; forming a plurality of touch electrode wirings which are electrically insulated with each other, an organic functional layer, and a plurality of first electrodes which are electrically insulated with each other sequentially on the base substrate, in which the plurality of the touch electrode wirings and the plurality of the first electrodes are in one-to-one correspondence; forming a first encapsulation structure on the plurality of the first electrodes, and then using a laser irradiation process to electrically connect the respective first electrodes with the touch electrode wirings corresponding thereto by via holes passing through the organic functional layer.

Figure 2:
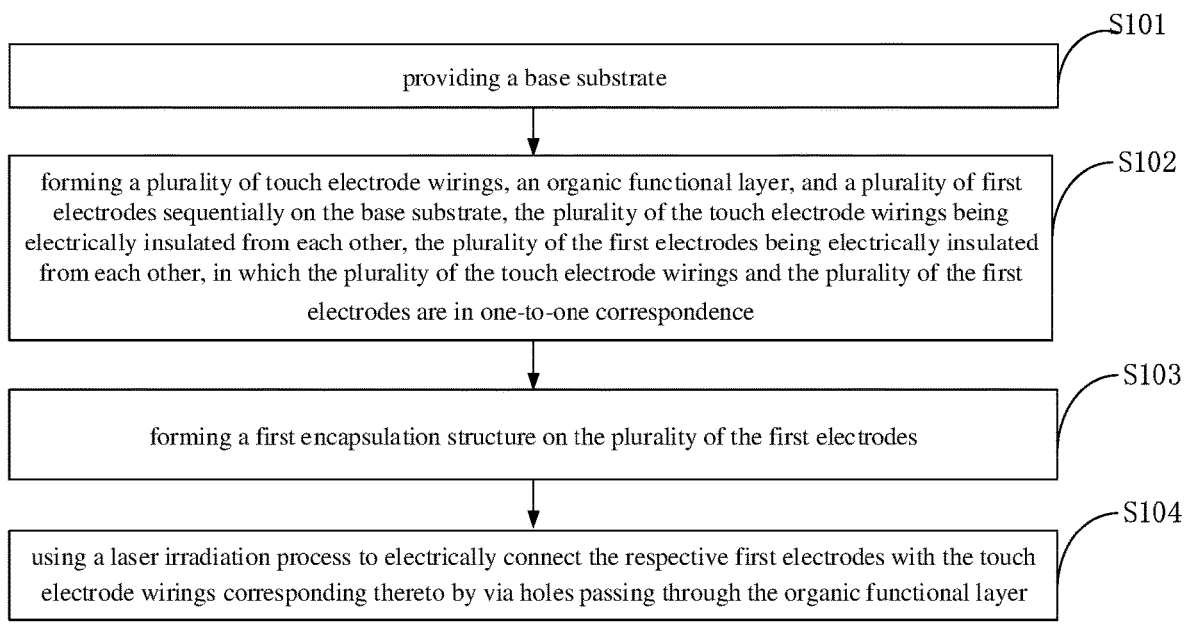
FIG. 2 is a flow chart of a preparation method of an organic light-emitting display panel provided by an embodiment of the present disclosure.

For example, FIG. 2 is a flow chart of a preparation method of an organic light-emitting display panel according to an embodiment of the present disclosure, and as illustrated in FIG. 2, the preparation method comprises:

S101: providing a base substrate.

For example, the base substrate is an insulating substrate, and the material of the base substrate is hard material, such as glass, quartz, resin material with a certain hardness and so on, or the material of the base substrate has a certain flexibility.

S102: forming a plurality of touch electrode wirings, an organic functional layer, and a plurality of first electrodes sequentially on the base substrate, the plurality of the touch electrode wirings being electrically insulated from each other, the plurality of the first electrodes being electrically insulated from each other, in which the plurality of the touch electrode wirings and the plurality of the first electrodes are in one-to-one correspondence.

For example, the touch electrode wirings are made of a conductive metal, that is the touch electrode wirings are metal wires. For example, the touch electrode wirings are made of a metal material such as molybdenum, titanium, copper and chromium or an alloy material formed of the above-described metals, for example, copper molybdenum alloy (CuMo), copper titanium alloy (CuTi), copper molybdenum titanium alloy (CuMoTi), copper molybdenum tungsten alloy (CuMoW), copper molybdenum niobium alloy (CuMoNb), chromium molybdenum alloy (CrMo), chromium titanium alloy (CrTi) and chromium molybdenum titanium alloy (CrMoTi) and so on.

For example, the organic functional layer includes a hole injection functional layer (HIL layer), a hole transport functional layer (HTL layer), a light-emitting layer, an electron transport functional layer (ETL layer) and an electron injection functional layer (EIL layer) which are sequentially stacked.

For example, the material of the hole transport functional layer (HTL layer) comprises at least one selected from a group consisting of an aromatic diamine compound, a triphenylamine compound, an aromatic triamine compound, a biphenyldiamine derivative, a triarylamine polymer and a carbazole polymer. For example, N,N'-(1-naphthyl)-N,N'-diphenyl-4,4'-biphenyldiamine (NPB), N,N'-bis(3-methylphenyl)-N,N'-diphenyl-4,4'-biphenyldiamine (TPD), 4,4',4"-tris(carbazol-9-yl)triphenylamine (TCTA) and polyvinyl carbazole or a monomer thereof.

For example, the material of the hole injection functional layer (HIL layer) comprises at least one selected from a group consisting of: poly(3,4-ethylenedioxythiophene)polystyrenesulfonic acid (PEDOT/PSS), polythiophene and polyaniline. The material of the hole injection layer comprises at least one selected from a group consisting of: tris[4-(5-phenyl-2-thienyl)benzene]amine, 4,4',4"-tris[2-naphthyl(phenyl)amino]triphenylamine (2-TNATA), 4,4',4"-tris(3-methylphenylanilino)triphenylamine (m-MTDATA), copper phthalocyanine (CuPc) or TPD.

For example, the material of the electron transport functional layer (ETL layer) comprises at least one selected from a group consisting of: 4,7-diphenyl-1,10-o-phenanthroline, 2,9-bis(naphthalen-2-yl)-4,7-diphenyl-1,10-phenanthroline, 4,7-diphenyl-1,10-phenanthroline, 2,9-dimethyl-4,7-biphenyl-1,10-o-phenanthroline and 8-hydroxyquinoline aluminum, and the material of the electron transport layer comprises at least one selected from a group consisting of: 8-hydroxyquinoline lithium (Liq), 8-hydroxyquinoline gallium, bis[2-(2-hydroxyphenyl-1)-pyridine]beryllium, 2-(4-diphenyl)-5-(4-tert-butylphenyl)-1,3,4-oxadiazole (PBD), 1,3,5-tris(N-phenyl-2-benzimidazole-2)benzene (TPBI), BCP and Bphen and so on.

For example, the material of the electron injection functional layer (EIL layer) comprises at least one selected from a group consisting of: LiF and 8-hydroxyquinoline lithium. The material of the electron injection functional layer can also be made of alkali metal oxide or other alkali metal fluoride and so on. The alkali metal oxide includes lithium oxide ($Li_2O$), lithium boron oxide ($LiBO_2$), potassium silicon oxide ($K_2SiO_3$) and cesium carbonate ($Cs_2CO_3$) and so on; and the alkali metal fluoride includes sodium fluoride (NaF) and so on.

For example, a material of the organic light-emitting layer is selected according to the color of emitted light. According to requirements, the material of the organic light-emitting layer in the embodiments of the present disclosure includes a fluorescent light-emitting material or a phosphorescent light-emitting material. For example, the organic light-emitting layer is made of a dopant material, that is, a dopant material is mixed into a host light-emitting material to obtain the light-emitting material. For example, the host light-emitting material is a metal compound material, an anthracene derivative, an aromatic diamine compound, a triphenylamine compound, an aromatic triamine compound, a biphenyldiamine derivative, or a triarylamine polymer and so on. For example, bis(2-methyl-8-hydroxyquinoline-N1,O8)-(1,1'-biphenyl-4-hydroxy)aluminum (Balq), 9,10-di(2-naphthyl)anthracene (ADN), TAZ, 4,4'-bis(9-carbazole)biphenyl (CBP), MCP, 4,4',4"-tris(carbazol-9-yl)triphenylamine (TCTA) or N,N'-(1-naphthyl)-N,N'-diphenyl-4,4'-biphenyldiamine (NPB) and so on. The fluorescent light-emitting material or the dopant material includes, for example, coumarin dyes (for example, coumarin 6, C-545T), quinacridone (DMQA), or 4-(dicyanomethylene)-2-methyl-6-(4-dimethylaminostyrene)-4H-pyran (DCM) series and so on. The phosphorescent light-emitting material or the dopant material includes, for example, metal complex light-emitting materials based on Ir, Pt, Ru and Os and so on, for example, Flrpic, Fir6, FirN4, FIrtaz, $Ir(ppy)_3$, $Ir(ppy)_2(acac)$, PtOEP, $(btp)_2Iracac$, $Ir(piq)_2(acac)$ or $(MDQ)_2Iracac$ and so on. In addition, the light-emitting material also includes a case of double-host material which has being doped.

For example, the first electrode is made of a conductive material having a small electrical resistance such as a metal. The material of the first electrode includes a single metal such as silver, magnesium, aluminum and lithium, or an alloy such as magnesium aluminum alloy (MgAl) or lithium aluminum alloy (LiAl).

For example, the plurality of the first electrodes which are electrically insulated with each other are multiplexed as the touch electrodes, to realize the touch and display, without preparing additional touch electrodes, so that the process is reduced, which is beneficial to realize the lightness and thinness of the organic light-emitting display substrate, reduce costs, and improve the yield of the organic light-emitting display panel.

For example, in a case that the first electrodes are multiplexed as touch electrodes, the organic light-emitting display panel is a touch display panel. A time period of each frame of the touch display panel is divided into a display time period and a touch time period. In the display time period, a common voltage signal is loaded to the first electrode, so that the touch display panel displays; and in the touch time period, a touch scan signal is loaded to one of the first electrodes, and the one of the first electrodes is multiplexed as the touch electrode, which achieves the collection of touch positions, so as to achieve the purpose of touch.

For example, if the touch electrode wirings and the first electrodes are formed in different layers, it is not necessary to provide the touch electrode wirings in the layer where the first electrodes are located, in this way, an area occupied by the first electrodes is increased, the touch blind region is avoided and the touch performance is improved.

S103: forming a first encapsulation structure on the plurality of the first electrodes.

For example, the first encapsulation structure includes a transparent inorganic insulating layer, and the first encapsulation structure has performances of light transmission and isolation of water and oxygen.

For example, a material of the first encapsulation layer includes silicon nitride and silicon oxide and so on.

S104: using a laser irradiation process to electrically connect the respective first electrodes with the touch electrode wirings corresponding thereto by via holes passing through the organic functional layer.

For example, after the first encapsulation structure is formed, the laser irradiation process is used to form the via holes passing through the organic functional layer and melt the first electrodes, so that the molten first electrode material flows into the via holes to electrically connect the first electrodes with the respective touch electrode wirings corresponding thereto, which prevents impurity particles from entering the organic functional layer to reduce purity of the organic functional layer. Since the first encapsulation structure is made of a transparent inorganic insulating material, the first encapsulation structure is neither melt by absorbing the energy of laser, nor carbonized by heating to form impurity particles. In addition, the organic functional layer is not exposed to the outside, there are fewer impurity particles formed by carbonization of the organic functional layer during the laser irradiation, and the impurity particles only stay in the via holes, which prevents the impurity particles generated in the laser irradiation process from entering the organic functional layer to reduce the purity of the organic functional layer, which ensures the performance of the organic light-emitting display panel.

It should be noted that, the via holes are generated in the laser irradiation process, in a case that the organic functional layer is irradiated by laser, laser-irradiated portions of the organic functional layer are carbonized to form the via holes.

In the above-described steps, the laser irradiation process easily causes damage to the first encapsulation structure, and a surface of the first encapsulation structure is easy to crack, so that water and oxygen may easily enter the organic light-emitting display panel to form bad spots. For example, FIG. 3 is a flow chart of a preparation method of an organic light-emitting display panel provided by another embodiment of the present disclosure, as illustrated in FIG. 3, using a laser irradiation process to electrically connect the respective first electrodes with the touch electrode wirings corresponding thereto by via holes passing through the organic functional layer further comprises:

S105: forming a second encapsulation structure on the first encapsulation structure.

For example, the second encapsulation structure comprises an inorganic encapsulation layer and an organic encapsulation layer which are sequentially stacked and alternately arranged. A material of the inorganic encapsulation layer includes silicon nitride and silicon oxide and so on, and the organic encapsulation layer includes a single film layer or a composite film layer made of photosensitive resin, for example, the photosensitive resin is polyacrylic resin, polyimide resin, or polyamide resin and so on.

Figure 3:
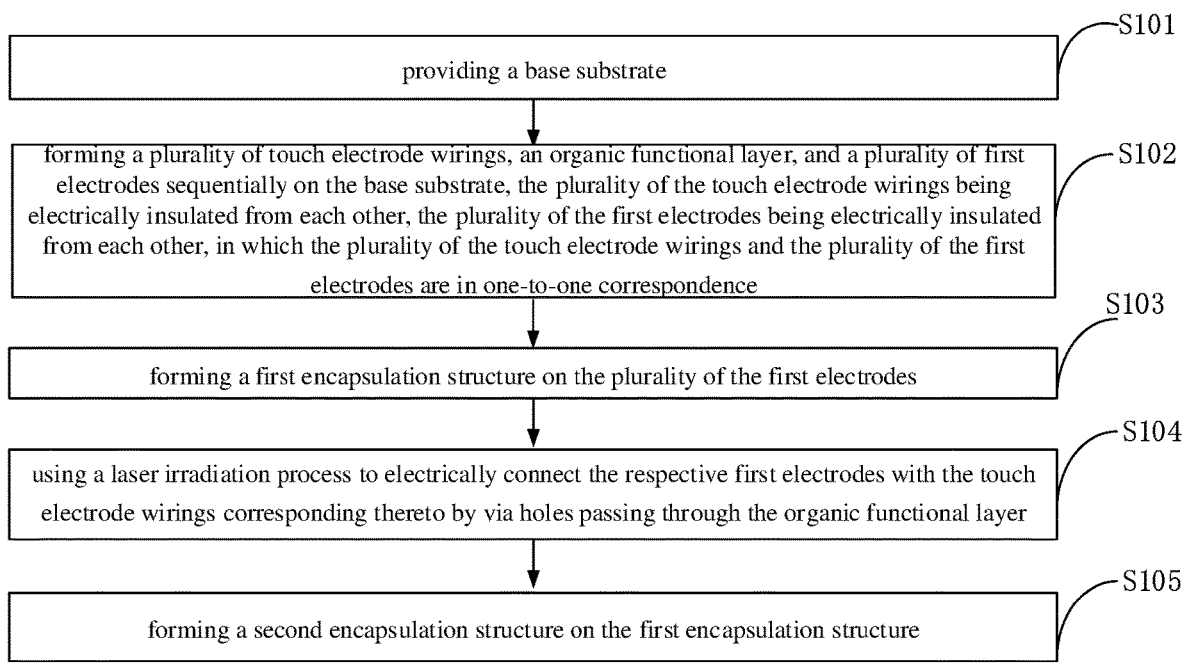
FIG. 3 is a flow chart of a preparation method of an organic light-emitting display panel provided by another embodiment of the present disclosure.

For example, in the preparation method of the organic light-emitting display panel illustrated in FIG. 3, after the first encapsulation structure is formed on the plurality of the first electrodes, the laser irradiation process is used to electrically connect the respective first electrodes and the touch electrode wirings corresponding thereto by the via holes passing through the organic functional layer, then the second encapsulation structure covering the first encapsulation structure is formed, so that the firstly formed first encapsulation structure prevents impurity particles generated in the laser irradiation process from affecting the performance of the device, and the second encapsulation structure formed after electrically connecting the respective first electrodes and the touch electrode wirings corresponding thereto by the via holes ensures stability of encapsulation. Therefore, the preparation method of the organic light-emitting display panel provided by the embodiment of the present disclosure avoids the impurity particles generated in the laser irradiation process from affecting the organic light-emitting display panel, and at a same time, ensures stability of encapsulation of the organic light-emitting display panel, thereby the performance of the organic light-emitting display panel is improved.

Figure 4:
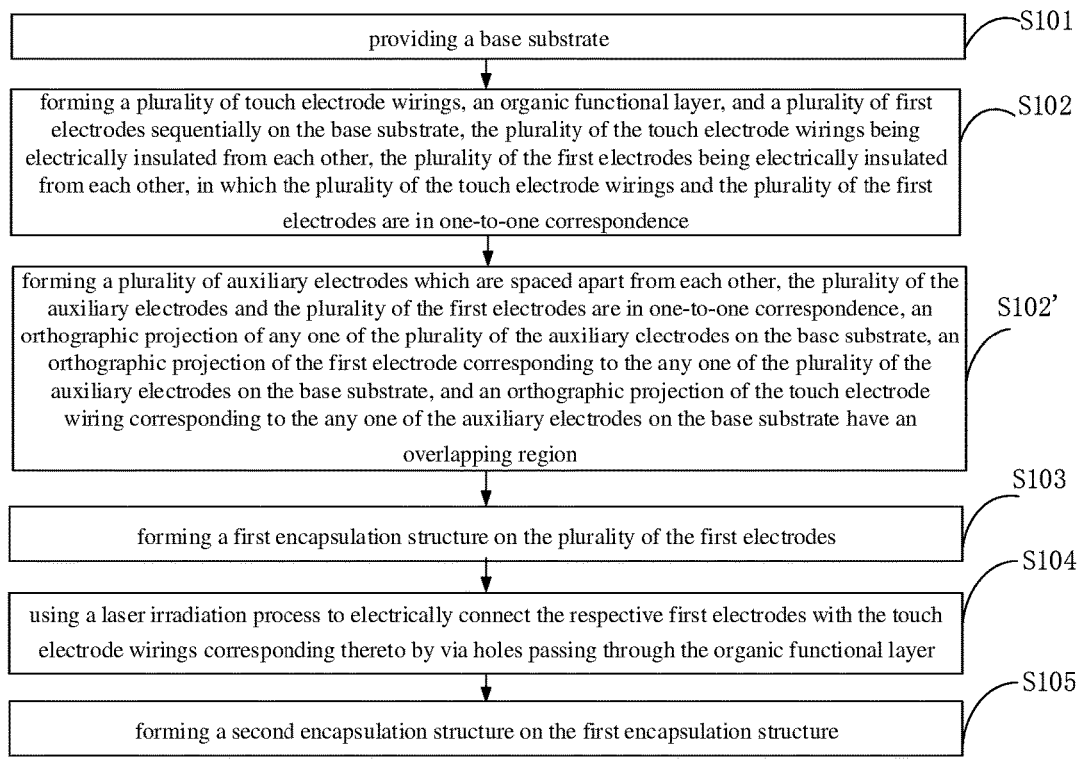
FIG. 4 is a flow chart of a preparation method of an organic light-emitting display panel provided by still another embodiment of the present disclosure.

For example, for a top light-emitting device, the first electrodes are used as the cathodes, and a thickness of each of the first electrodes is about 10 nm, since the thickness of each of the first electrodes is small, when the laser irradiation process is used to form the via holes passing through the organic functional layer so as to electrically connect the first electrodes with the touch electrode wirings corresponding thereto, the first electrode material flowing into the via holes may be insufficient, which is not favorable for forming a stable conductive channel. For example, FIG. 4 is a flow chart of a preparation method of an organic light-emitting display panel provided by still another embodiment of the present disclosure, as illustrated in FIG. 4, after forming the first electrodes, and before forming the first encapsulation structure, the preparation method further comprises:

S102': forming a plurality of auxiliary electrodes which are spaced apart from each other, the plurality of the auxiliary electrodes and the plurality of the first electrodes are in one-to-one correspondence, an orthographic projection of any one of the plurality of the auxiliary electrodes on the base substrate, an orthographic projection of the first electrode corresponding to the any one of the plurality of the auxiliary electrodes on the base substrate, and an orthographic projection of the touch electrode wiring corresponding to the one of the auxiliary electrodes on the base substrate have an overlapping region, such that in the laser irradiation process, laser is incident from a side of the first encapsulation structure that is away from the base substrate, and the respective auxiliary electrodes are melted by the laser irradiation process and material of the molten auxiliary electrodes flows into the via holes passing through the organic functional layer to electrically connect the respective first electrodes with the touch electrode wirings corresponding thereto. The auxiliary electrodes provide more material for conducting the first electrodes with the touch electrode wirings, which improves a conduction rate between the respective first electrodes and the touch electrode wirings corresponding thereto, which ensures stability of conduction between the first electrodes and the touch electrode wirings.

For example, the orthographic projection of any one of the plurality of the auxiliary electrodes on the base substrate, the orthographic projection of the first electrode corresponding to the any one of the plurality of the auxiliary electrodes on the base substrate, and the orthographic projection of the touch electrode wiring corresponding to the any one of the plurality of the auxiliary electrodes on the base substrate have a completely overlapping region or a partially overlapping region.

For example, the orthographic projection of any one of the plurality of the auxiliary electrodes on the base substrate is completely located in the orthographic projection of the first electrode corresponding to the any one of the plurality of the auxiliary electrodes on the base substrate, and the orthographic projection of any one of the plurality of the touch electrode wirings on the base substrate is completely located in the orthographic projection of the first electrode corresponding to the any one of the plurality of the touch electrode wirings on the base substrate.

For example, the auxiliary electrodes are made of at least one of aluminum, copper, silver, gold, platinum, nickel and molybdenum having good electrical conductivity. The material of the auxiliary electrodes is the same as or different from the material of the first electrode, which are not limited herein.

For example, after forming the organic functional layer and before forming the plurality of the first electrodes, the method further comprises: forming a plurality of spacers on the organic functional layer, each of the plurality of the spacers having a longitudinal cross-section in a shape of inverted trapezoid.

For example, the first electrodes are formed by an evaporation process, and forming the first electrodes by using the evaporation process includes: forming a first electrode layer by an evaporation method, and the first electrode layer cracks at edges of the plurality of the spacers to form the plurality of the first electrodes being electrically insulated from each other.

For example, in addition to being used to assist in forming the first electrodes that are electrically insulated from each other, the spacers also play a role of supporting, such as play the role of supporting the organic light-emitting display panel and an encapsulation substrate for encapsulating the organic light-emitting display panel.

For example, material of the spacers includes: an insulating inorganic material (for example, silicon nitride, silicon carbide and silicon oxide), an organic polymer material (for example, polyimide and polytetrafluoroethylene and so on), and photoresist and so on.

For example, each of the plurality of the spacers has a longitudinal cross-section in a shape of inverted trapezoid, that is a width of each of the spacers gradually increases in a direction from the base substrate to the first electrode corresponding thereto, so that in the process of forming the first electrodes by using the evaporation process, such a structure with a larger upper width and a smaller lower width allows the first electrode layer to crack directly at the edges of the spacers. If each of the spacers has a structure with an upper width and a lower width that are equal to each other, or a structure with a smaller upper width and a larger lower width, rather than the structure with the larger upper width and the smaller lower width, then the formed first electrodes are apt to remain a connected status at the edges of the spacers, which fail to electrically insulate the first electrodes from each other.

For example, a section shape of each of the spacers is limited in the embodiment of the present disclosure, which is not limited to the case where each of the plurality of the spacers has a longitudinal cross-section in a shape of inverted trapezoid, as long as the first electrode layer formed as a whole cracks at the edges of the spacers to form the first electrodes that are electrically insulated from each other.

For example, the organic light-emitting display panel comprises a display region and a peripheral region outside the display region, and the display region is also referred to as an active area (AA), and the active area is usually used for display; and the peripheral area is used for arranging driving circuits and for packaging the display panel and so on. In order not to affect display, in the above-described preparation method provided by the embodiment of the present disclosure, the laser irradiation process is used in a non-display region, that is, the peripheral region, to electrically connect the respective first electrodes with the touch electrode wirings corresponding thereto by the via holes passing through the organic functional layer.

For example, the preparation method of the organic light-emitting display panel further comprises: sequentially forming a driving circuit, a second electrode and a pixel definition layer on the base substrate, in which the driving circuit comprises a gate electrode, a first source-drain electrode, and a second source-drain electrode; and the second electrode is electrically connected with the first source-drain electrode or the second source-drain electrode.

For example, in an example, the touch electrode wirings are formed on a side of the pixel definition layer that is away from the base substrate. Thus, a distance between any one of the touch electrode wirings and the first electrode corresponding thereto is closer, which improves accuracy of touch.

For example, material of the pixel definition layer includes an organic insulating material (for example, acrylic resin) or an inorganic insulating material (for example, silicon nitride $SiN_x$ or silicon oxide $SiO_x$).

For example, in another example, the touch electrode wirings are formed in a same layer as the gate electrode, or the touch electrode wirings are formed in a same layer as the first source-drain electrode or the second source-drain electrode, thereby one patterning process is saved and the production cost is reduced. It should be noted that, the "formed in a same layer" refers to that the touch electrode wirings are formed in a same process as the gate electrode or the first source-drain electrode or the second source-drain electrode, and the touch electrode wirings and the electrode disposed in a same layer are made of a same material.

For example, the second electrode is used as an anode. The second electrode is made of a transparent conductive material, and the transparent conductive material includes indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO) and a carbon nanotube and so on.

For example, the second electrode has a laminate structure formed of any combination of the transparent conductive material and the metal conductive material as described above, for example: a structure formed of one layer of metal conductive material sandwiched between two layers of transparent conductive material which are made of ITO-Ag-ITO, ITO-Mo-IZO, ITO-Cr—$In_2O_3$, ITO-Cu—ZnO and ITO-Pt-IGO, or a two-layer laminate structure formed of one layer of metal conductive material and one layer of transparent conductive material which are made of IZO-Mo, ITO-Cr, ZnO—Mg and ITO-Au. For example, the laminate structure formed of any combination of the transparent conductive material and the metal conductive material is not limited to the two-layer or three-layer laminate structure as described above.

A preparation process of an organic light-emitting display panel provided by an embodiment of the present disclosure is described below, for example, FIG. 5A to FIG. 5H are cross-sectional structural schematic diagrams after performing respective steps in the preparation method of the organic light-emitting display panel provided by the embodiment of the present disclosure.

Figure 5A:
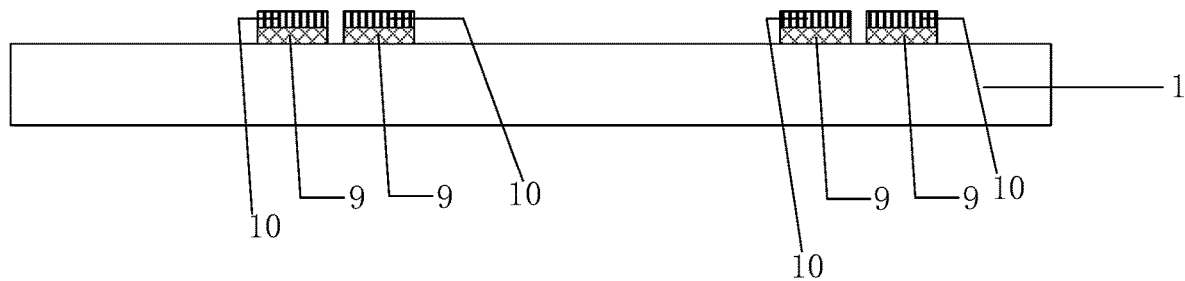
FIG. 5A to FIG. 5H are cross-sectional structural schematic diagrams after performing respective steps in a preparation method of an organic light-emitting display panel provided by an embodiment of the present disclosure.

As illustrated in FIG. 5A, a driving circuit 9 and a second electrode 10 are firstly formed on a base substrate 1.

Figure 5B:
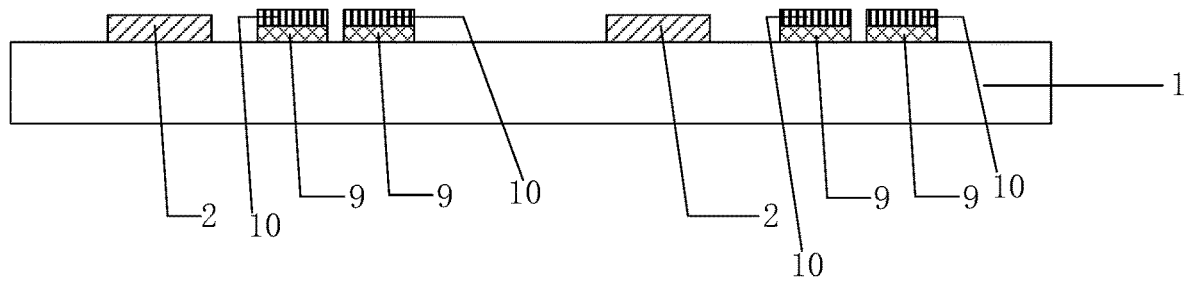

As illustrated in FIG. 5B, a plurality of touch electrode wirings 2 are formed in a non-display region on the base substrate 1 where the driving circuit 9 and the second electrode 10 are formed.

For example, a pixel definition layer is firstly formed on the base substrate 1 on which the driving circuit 9 and the second electrode 10 are formed, and then the plurality of the touch electrode wirings 2 are formed on the pixel definition layer.

Figure 5C:
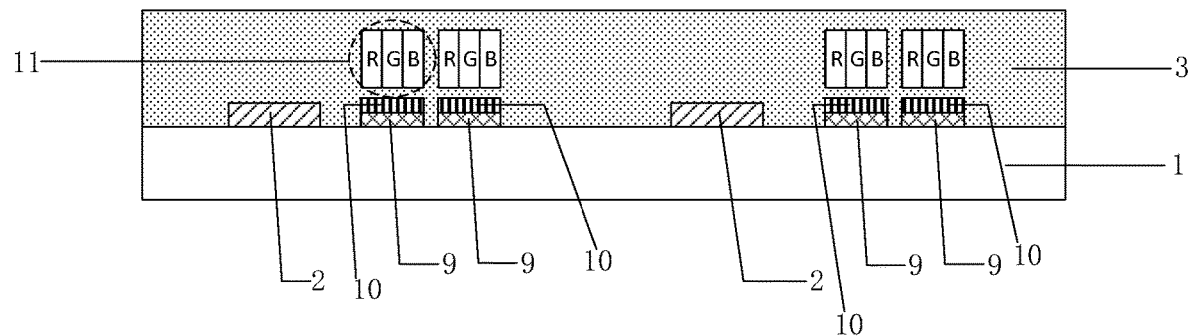

As illustrated in FIG. 5C, an organic functional layer 3 and a light-emitting layer 11 are formed on the base substrate 1 on which the plurality of the touch electrode wirings 2 are formed, and the organic functional layer 3 and the light-emitting layer 11 are usually formed by the evaporation method.

Figure 5D:
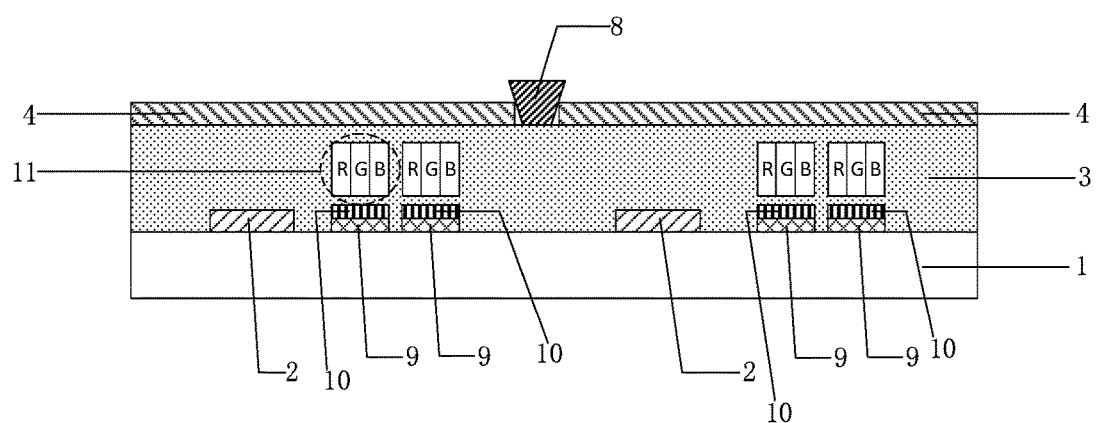

As illustrated in FIG. 5D, a plurality of spacers 8 are formed on the organic functional layer 3, each of the plurality of the spacers has a longitudinal cross-section in a shape of inverted trapezoid, and the plurality of the first electrodes 4 electrically insulated from each other are formed on the base substrate 1 on which the inverted trapezoidal spacers 8 are formed. That is, an entire first electrode layer is divided by the inverted trapezoidal spacers 8 to form the plurality of the first electrodes 4 which are electrically insulated from each other.

Figure 5E:
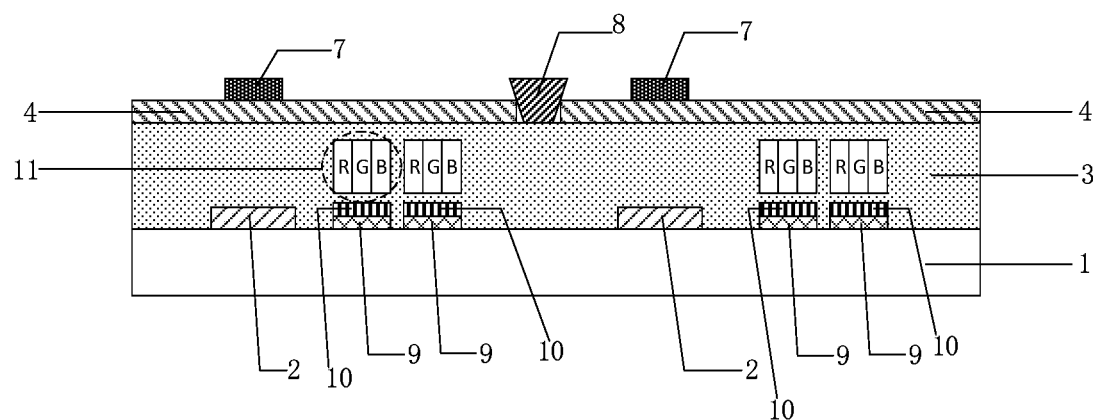

As illustrated in FIG. 5E, a plurality of auxiliary electrodes 7 in one-to-one correspondence with the respective first electrodes 4 are evaporated with a fine metal mask (FMM mask) on the base substrate 1 on which the plurality of the first electrodes 4 are formed. An orthographic projection of any one of the auxiliary electrodes 7 on the base substrate, an orthographic projection of the first electrode 4 corresponding to the any one of the auxiliary electrodes 7 on the base substrate, and an orthographic projection of the touch electrode wiring 2 corresponding to the any one of the plurality of the auxiliary electrodes 7 on the base substrate 1 have an overlapping region, which ensures that the any one of the plurality of the auxiliary electrode 7 is formed directly above the corresponding first electrode 4 and the corresponding touch electrode wiring 2, and further ensures that the plurality of the auxiliary electrodes do not reduce the light transmission efficiency of the organic light-emitting display panel.

Figure 6:
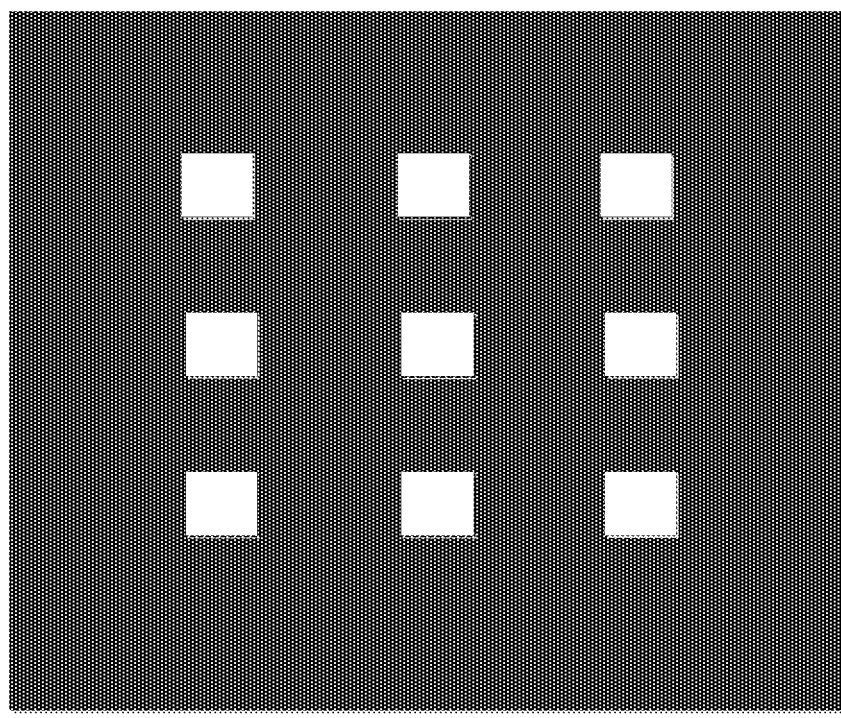
FIG. 6 is a planar structural schematic diagram of a fine metal mask provided an embodiment of the present disclosure.

For example, FIG. 6 is a planar structural schematic diagram of the fine metal mask provided by the embodiment of the present disclosure. As illustrated in FIG. 6, blank regions are regions for forming the auxiliary electrodes 7 correspondingly.

Figure 5F:
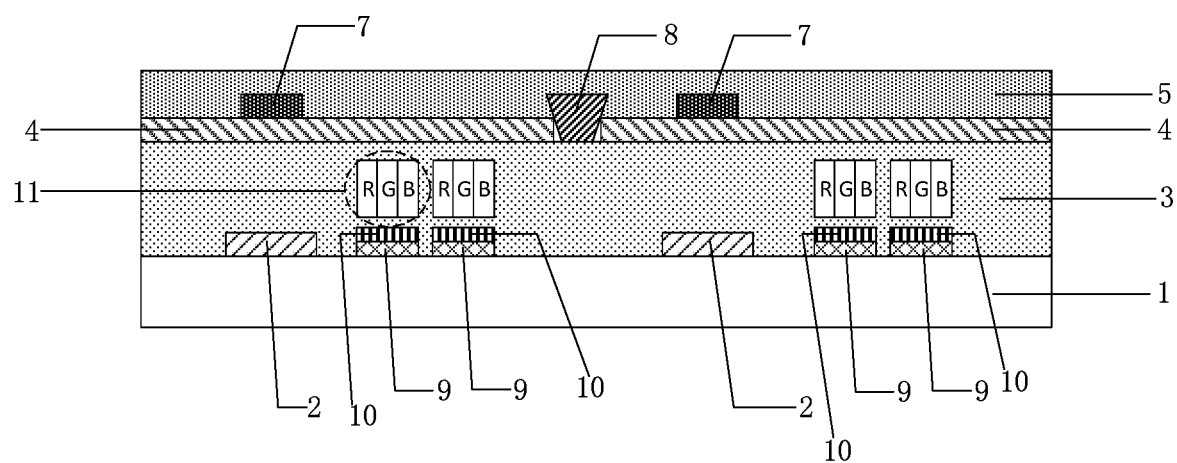

As illustrated in FIG. 5F, a first encapsulation structure 5 is formed by a vapor phase chemical deposition method on the base substrate 1 on which the auxiliary electrodes 7 are formed. In the process, a case that the first encapsulation structure 5 is a transparent inorganic insulating layer is taken as an example, and the material of the first encapsulation structure 5 can refer to the above related descriptions.

Figure 5G:
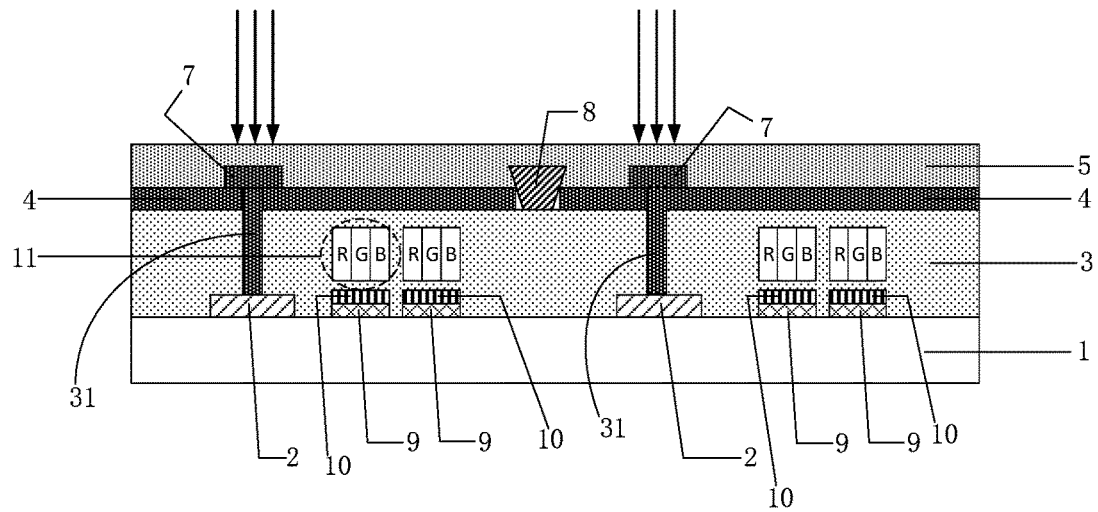

As illustrated in FIG. 5G, laser (indicated by arrows) is incident from a side of the first encapsulation structure 5 that is away from the base substrate in a vacuum environment, and the molten auxiliary electrodes 7 and a portion of the first electrodes flow into via holes 31 in the organic functional layer 3, so that the first electrodes 4 are electrically connected with the touch electrode wirings 2 by the via holes 31 passing through the organic functional layer 3, which ensures the stability of electrical connections between the first electrodes 4 and the touch electrode wirings 2.

Figure 5H:
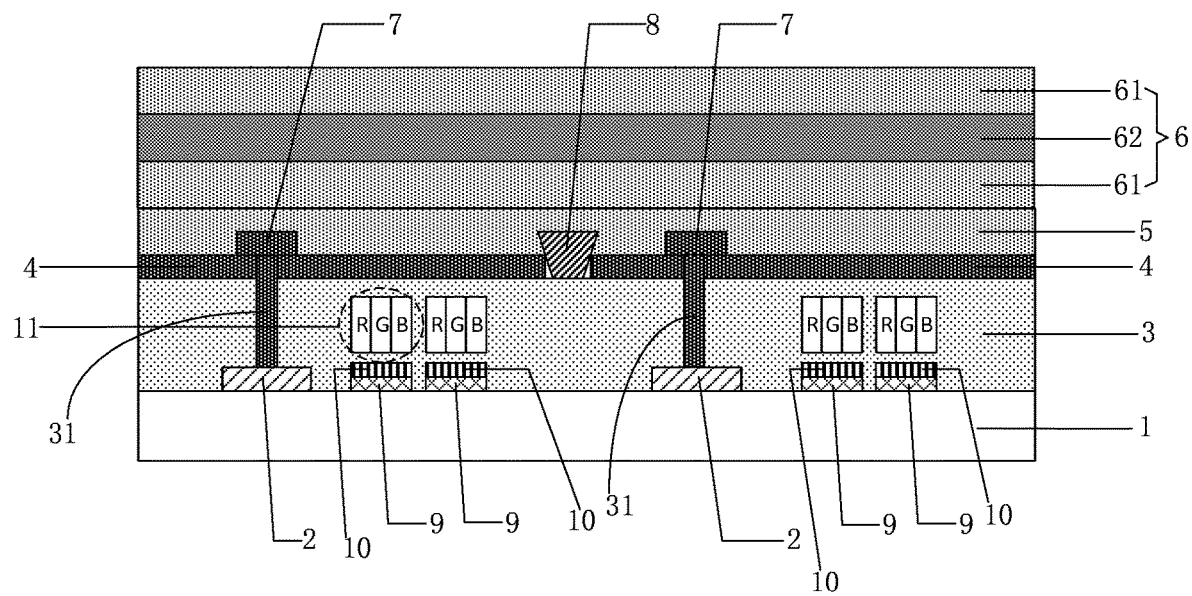

As illustrated in FIG. 5H, after the laser irradiation process is performed, a second encapsulation structure 6 covering the first encapsulation structure 5 is formed, and the second encapsulation structure 6 includes an inorganic encapsulation layer 61 and an organic encapsulation layer 62 which are sequentially stacked and alternately arranged, which prevents impurity particles generated in the laser irradiation process from affecting the organic light-emitting display panel, and at a same time, ensures stability of encapsulation of the organic light-emitting display panel, thereby the performance of the organic light-emitting display panel is improved.

For example, the structure and the material of the second encapsulation structure 6 can refer to the above related descriptions, which are omitted herein.

Figure 7:
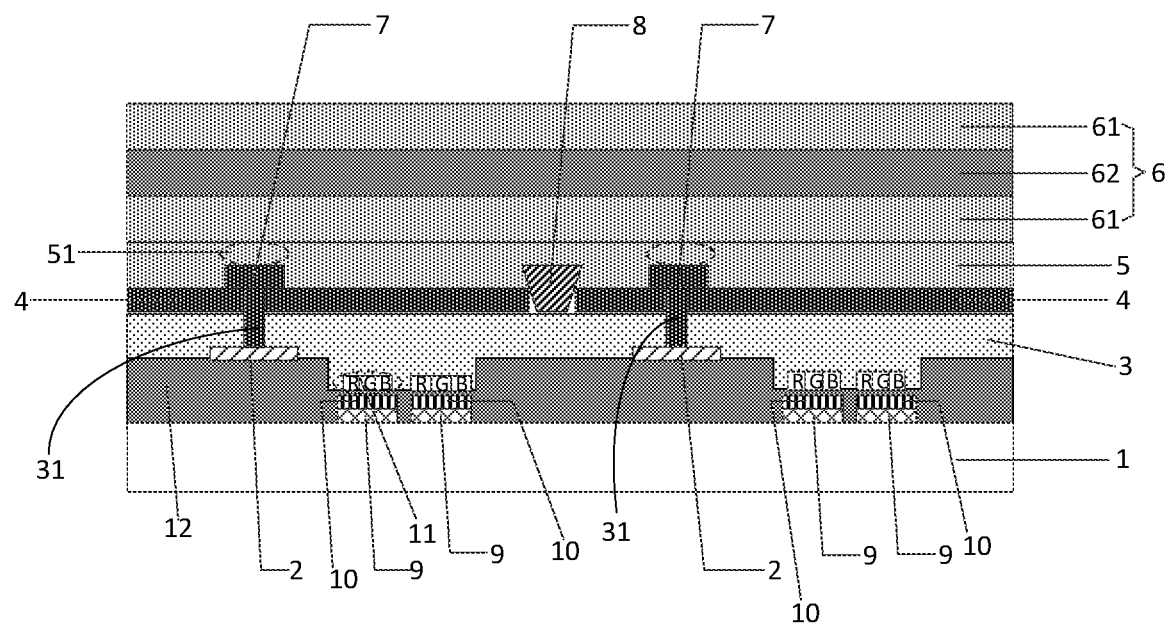
FIG. 7 is a cross-sectional structural schematic diagram of an organic light-emitting display panel provided by an embodiment of the present disclosure.

At least one embodiment of the present disclosure further provides an organic light-emitting display panel, for example, FIG. 7 is a cross-sectional structural schematic diagram of the organic light-emitting display panel provided by the embodiment of the present disclosure. As illustrated in FIG. 7, the organic light-emitting display panel comprises: a base substrate 1; a plurality of touch electrode wirings 2, an organic functional layer 3, a plurality of first electrodes 4 and a first encapsulation structure 5 which are arranged on the base substrate 1 sequentially, in which the plurality of the touch electrode wirings are electrically insulated from each other, the plurality of the first electrodes are electrically insulated from each other, and the plurality of the touch electrode wirings 2 are electrically connected with the plurality of the first electrodes 4 in one-to-one correspondence by a plurality of via holes 31 passing through the organic functional layer 3; the first encapsulation structure 5 comprises a plurality of regions 51 to be irradiated by laser, and the plurality of the regions 51 to be irradiated by laser and the plurality of the via holes 31 are in one-to-one correspondence in a direction perpendicular to the base substrate 1.

For example, the plurality of the regions 51 to be irradiated by laser have different physical properties with respect to other portions of the first encapsulation structure 5, for example, different light transmittance, different color or different appearance and so on. This is because irradiated portions of the first encapsulation structure 5 (that is the plurality of the regions to be irradiated by laser) are at least partially modified by heat brought by the laser in the process that the laser irradiates the first encapsulation structure 5. For example, organic matter in the organic layer is partially decomposed, and an inorganic layer breaks due to thermal expansion and contraction, so that the laser irradiated region of the first encapsulation structure has a refractive effect on light incident from it, thereby the plurality of the regions to be irradiated by laser exhibits physical properties different from other portions.

For example, before and after the first electrodes 4 electrically connecting with the corresponding touch electrode wirings 2 the purity of the organic functional layer 3 remains unchanged. It should be noted that, the purity of the organic functional layer 3 remains unchanged refers to that before and after the first electrodes 4 electrically connecting with the corresponding touch electrode wirings 2 the organic functional layer 3 does not contain impurity particle, or before and after the first electrodes 4 electrically connecting with the corresponding touch electrode wirings the content of the impurity particle in the organic functional layer 3 remains unchanged.

For example, the organic light-emitting display panel is a touch display panel, the first electrodes 4 are multiplexed as touch electrodes. A time period of each frame of the touch display panel is divided into a display time period and a touch time period. In the display time period, a common voltage signal is loaded to the first electrode 4, so that the touch display panel displays; and in the touch time period, a touch scan signal is loaded to one of the first electrodes 4, and the one of the first electrodes 4 is multiplexed as the touch electrode, which achieves the collection of touch positions, so as to achieve the purpose of touch.

For example, the base substrate 1 is an insulating substrate, and the material of the base substrate is hard material, such as glass, quartz, resin material with a certain hardness and so on, or the material of the base substrate has a certain flexibility.

For example, the touch electrode wirings 2 are made of a conductive metal, that is the touch electrode wirings are metal wires. For example, the touch electrode wirings 2 are made of a metal material such as molybdenum, titanium, copper and chromium or an alloy material formed of the above-described metals, for example, copper molybdenum alloy (CuMo), copper titanium alloy (CuTi), copper molybdenum titanium alloy (CuMoTi), copper molybdenum tungsten alloy (CuMoW), copper molybdenum niobium alloy (CuMoNb), chromium molybdenum alloy (CrMo), chromium titanium alloy (CrTi) and chromium molybdenum titanium alloy (CrMoTi) and so on.

For example, the organic functional layer 3 includes a hole injection functional layer (HIL layer), a hole transport functional layer (HTL layer), a light-emitting layer 11 (a red sub-pixel R, a green sub-pixel G and a blue sub-pixel B), an electron transport functional layer (ETL layer) and an electron injection functional layer (EIL layer) which are sequentially stacked.

For example, the materials of the hole injection functional layer, the hole transport functional layer, the light-emitting layer, the electron transport functional layer and the electron injection functional layer can refer to the above related descriptions, which are omitted herein.

For example, for a top light-emitting device, a thickness of each of the first electrodes is about 10 nm, when the laser irradiation process is used to form the via holes 31 passing through the organic functional layer so as to electrically connect the first electrodes 4 with the touch electrode wirings 2 corresponding thereto, the material of the first electrodes flowing into the via holes 31 may be insufficient, which is not favorable for forming a stable conductive channel. For example, as illustrated in FIG. 7, the organic light-emitting display panel further comprises a plurality of auxiliary electrodes 7 that are located between the plurality of the first electrodes 4 and the first encapsulation structure 5 that are in one-to-one correspondence with the plurality of the first electrodes 4. An orthographic projection of any one of the plurality of the auxiliary electrodes 7 on the base substrate 1, an orthographic projection of the first electrode 4 corresponding to the any one of the plurality of the auxiliary electrodes 7 on the base substrate 1, and an orthographic projection of the touch electrode wiring 2 corresponding to the any one of the plurality of the auxiliary electrodes 2 on the base substrate 1 have an overlapping region.

For example, the orthographic projection of any one of the plurality of the auxiliary electrodes 7 on the base substrate, 1 the orthographic projection of the first electrode 4 corresponding to the any one of the plurality of the auxiliary electrodes 7 on the base substrate 1, and the orthographic projection of the touch electrode wiring 2 corresponding to the any one of the plurality of the auxiliary electrodes 7 on the base substrate 1 have a completely overlapping region or a partially overlapping region.

For example, the orthographic projection of any one of the plurality of the auxiliary electrodes 7 on the base substrate 1 is completely located in the orthographic projection of the first electrode 4 corresponding to the any one of the plurality of the auxiliary electrodes 7 on the base substrate 1, and the orthographic projection of any one of the plurality of the touch electrode wirings 2 on the base substrate 1 is completely located in the orthographic projection of the first electrode 4 corresponding to the any one of the plurality of the touch electrode wirings 2 on the base substrate 1.

For example, the auxiliary electrodes 7 are made of at least one of aluminum, copper, silver, gold, platinum, nickel and molybdenum having good electrical conductivity. The material of the auxiliary electrodes 7 is the same as or different from the material of the first electrode, which are not limited herein.

Therefore, in the embodiment of the present disclosure, the auxiliary electrodes 7 are provided, such that when the laser irradiation process is used, laser is incident from a side of the first encapsulation structure 5 that is away from the base substrate 1, the laser melts the respective auxiliary electrodes 7, and the material of the respective molten auxiliary electrodes 7 flows into the via holes 31 passing through the organic functional layer 3 to electrically connect the respective first electrodes 4 corresponding thereto with the touch electrode wirings 2. The auxiliary electrodes 7 provide more material for conducting the first electrodes 4 with the touch electrode wirings 2, which improves a conduction rate between the first electrodes 4 and the touch electrode wirings 2, and ensures stability of the conduction between the first electrodes 4 and the touch electrode wirings 2.

For example, the auxiliary electrodes 7 are made of at least one of aluminum, copper, silver, gold, platinum, nickel and molybdenum having good electrical conductivity. The material of the auxiliary electrodes 7 is the same as or different from the material of the first electrode, which are not limited herein.

For example, the first encapsulation structure 5 prevents the impurity particles generated in the laser irradiation process from affecting the performance of the organic light-emitting display panel, and the first encapsulation structure 5 includes a transparent inorganic insulating layer. For example, a material of the first encapsulation structure 5 includes silicon nitride and silicon oxide and so on.

It should be noted that, the first encapsulation structure 5 is a single-layer structure or a multi-layer structure, and the embodiment of the present disclosure takes the first encapsulation structure 5 including a transparent inorganic insulating layer as an example to illustrate.

For example, the first encapsulation structure 5 is easy to be damaged to generate cracks under the irradiation of laser energy, and external water and oxygen are easy to enter the organic light-emitting display panel from the damaged portions of the first encapsulation structure 5. Therefore in order to prevent water and oxygen from entering the organic light-emitting display panel 5, after the laser irradiation process is used to electrically connect the respective first electrodes 4 and the touch electrode wirings 2 corresponding thereto by the via holes 31 passing through the organic functional layer 3, a second encapsulation structure 6 covering the first encapsulation structure 5 is formed. As illustrated in FIG. 7, the second encapsulation structure 6 includes an inorganic encapsulation layer 61 and an organic encapsulation layer 62 which are sequentially stacked and alternately arranged. The structure that the inorganic encapsulation layer 61 and the organic encapsulation layer 62 are alternately arranged can effectively block water and oxygen, so that the stability of encapsulation of the organic light-emitting display panel is improved. The first encapsulation structure 5 prevents the impurity particles generated in the process of forming the via holes by using the laser irradiation process from affecting the performance of the organic light-emitting display panel, and the second encapsulation structure 7 ensures the stability of encapsulation.

For example, a material of the inorganic encapsulation layer includes $SiN_x$, and the material of the inorganic encapsulation layer may also be other material, which is not limited herein.

For example, as illustrated in FIG. 7, the organic light-emitting display panel further comprises a plurality of spacers 8 disposed on the organic functional layer 3, each of the plurality of the spacers has a longitudinal cross-section in a shape of inverted trapezoid, and the spacers 8 electrically insulate the plurality of the first electrodes 4.

For example, in addition to being used to assist in forming the first electrodes 4 that are electrically insulated from each other, the spacers 8 also play a role of supporting, such as play the role of supporting the organic light-emitting display panel and an encapsulation substrate for encapsulating the organic light-emitting display panel.

For example, the material of the spacers 8 includes: an insulating inorganic material (for example, silicon nitride, silicon carbide and silicon oxide), an organic polymer material (for example, polyimide and polytetrafluoroethylene and so on), and photoresist and so on.

For example, longitudinal cross-section shapes of the spacers 8 are inverted trapezoids, that is a width of each of the spacers 8 gradually increases in a direction from the base substrate 1 to the first electrode 4 corresponding thereto, so that in the process of forming the first electrodes 4 by using the evaporation process, such a structure with a larger upper width and a smaller lower width allows the first electrode layer to crack directly at the edges of the spacers 8. If each of the spacers 8 has a structure with an upper width and a lower width that are equal to each other, or a structure with a smaller upper width and a larger lower width, rather than the structure with the larger upper width and the smaller lower width, then the formed first electrodes 4 are apt to remain a connected status at the edges of the spacers 8, which fail to electrically insulate the first electrodes 4 from each other.

For example, a longitudinal cross-section shape of each of the spacers 8 is not limited in the embodiment of the present disclosure, which is not limited to the case where the longitudinal cross-section shapes of the spacers 8 are inverted trapezoids, as long as the first electrode layer formed as a whole cracks at the edges of the spacers to form the first electrodes that are electrically insulated from each other.

For example, as illustrated in in FIG. 7, the organic light-emitting display panel further comprises a driving circuit 9, a second electrode 10 and a pixel definition layer 12 which are sequentially arranged on the base substrate 1, and the driving circuit 9 comprises a gate electrode, a first source-drain electrode, and a second source-drain electrode, and the second electrode 10 is electrically connected with the first source-drain electrode or the second source-drain electrode.

For example, in an example, the touch electrode wirings 2 are formed on a side of the pixel definition layer 12 that is away from the base substrate 1. Thus, a distance between any one of the touch electrode wirings 2 and the first electrode 4 corresponding thereto is closer, which improves accuracy of touch.

For example, in another example, the touch electrode wirings 2 are formed in a same layer as the gate electrode, or the touch electrode wirings 2 are formed in a same layer as the first source-drain electrode or the second source-drain electrode, thereby one patterning process is saved and the production cost is reduced. It should be noted that, the "formed in a same layer" refers to that the touch electrode wirings are formed in a same process as the gate electrode or the first source-drain electrode or the second source-drain electrode, and the touch electrode wirings and the electrode disposed in a same layer are made of a same material.

For example, at least one embodiment of the present disclosure further provides an organic light-emitting display panel formed by any one of the preparation methods mentioned above, and the organic light-emitting display panel comprises: a base substrate; a plurality of touch electrode wirings which are electrically insulated from each other, an organic functional layer, a plurality of first electrodes which are electrically insulated from each other and a first encapsulation structure which are sequentially disposed on the base substrate, and the plurality of the touch electrode wirings are connected with the plurality of the first electrodes in one-to-one correspondence by a plurality of via holes passing through the organic functional layer.

For example, after the first encapsulation structure is formed, the laser irradiation process is used to form the via holes passing through the organic functional layer and melt the first electrodes, so that the material of the molten first electrode flows into the via holes to electrically connect the first electrodes with the respective touch electrode wirings corresponding thereto, which prevents impurity particles from entering the organic functional layer to reduce purity of the organic functional layer, which ensures the performance of the organic light-emitting display panel.

Figure 8:
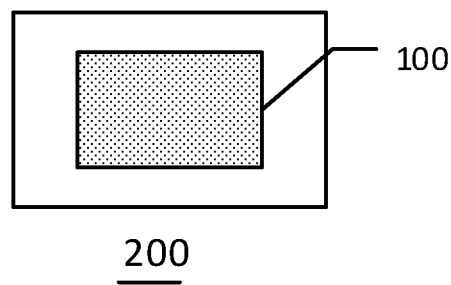
FIG. 8 is a block diagram of a display device provided by an embodiment of the present disclosure.

At least one embodiment of the present disclosure further provides a display device, for example, FIG. 8 is a block diagram of a display device provided by an embodiment of the present disclosure. As illustrated in FIG. 8, the display device 200 comprises any one of the organic light-emitting display panel 100 mentioned above. A principle that the display device solves problems is similar to that of the above-mentioned organic light-emitting display panel. Therefore, the implementation of the display device can refer to the implementation of the above-mentioned organic light-emitting display panels, which are omitted herein.

For example, the display device 200 is: a mobile phone, a tablet computer, a television, a monitor, a laptop computer, a digital photo frame, a navigator, and any other product or component having a display function. Other essential components of the display device are all possessed by ordinary technicians in the art, which are omitted herein and should not be taken as a limitation of the present disclosure.

Embodiments of the present disclosure provide the preparation method of the organic light-emitting display panel, the organic light-emitting display panel, and the display device, which have at least one of the following beneficial effects:

(1) In the preparation method of the organic light-emitting display panel provided by the embodiment of the present disclosure, the first encapsulation structure is formed on the first electrode, the laser irradiation process is used to electrically connect the respective first electrodes with the touch electrode wirings corresponding thereto by the via holes passing through the organic functional layer, which prevents impurity particles generated in the laser irradiation process from affecting the performance of the device.

(2) In the preparation method of the organic light-emitting display panel provided by the embodiment of the present disclosure, the second encapsulation structure formed after electrically connecting the respective first electrodes with the touch electrode wirings corresponding thereto by the via holes ensures stability of encapsulation.

(3) In the preparation method of the organic light-emitting display panel provided by the embodiment of the present disclosure, a first electrode layer is formed by an evaporation method, and the first electrode layer cracks at edges of the spacers to form the plurality of the first electrodes which are electrically insulated from each other, and the process is simple and easy.

(4) In the preparation method of the organic light-emitting display panel provided by the embodiment of the present disclosure, the touch electrode wirings are formed on a side of the pixel definition layer that is away from the base substrate, thus a distance between any one of the touch electrode wirings and the first electrode corresponding thereto is closer, which improves accuracy of touch.

The following points required to be explained:

(1) the drawings of the embodiments of the present disclosure only relate to the structures related to the embodiments of the present disclosure, and other structures can refer to the general design.

(2) for the sake of clarity, in the drawings used to describe the embodiments of the present disclosure, the thickness of layers or areas is enlarged or reduced, that is, the drawings are not drawn according to the actual scale. It is understood that in the case that an element such as a layer, membrane, region, or substrate is referred to as being "up" or "down" on another element, the element may be "directly" on "or" down "on another element or there may be intermediate elements.

(3) without conflict, the embodiments of the present disclosure and the features in the embodiments may be combined with each other to obtain new embodiments.

What are described above is related to only the illustrative embodiments of the present disclosure and not limitative to the protection scope of the present application. Any changes or substitutions that are easy for those skilled in the art to envisage are intended to be encompassed within the scope of the present disclosure. Therefore, the protection scope of the present application shall be defined by the accompanying claims.

What is claimed is:

1. A preparation method of an organic light-emitting display panel, comprising:
    providing a base substrate;
    forming a plurality of touch electrode wirings, an organic functional layer, and a plurality of first electrodes sequentially on the base substrate, the plurality of the touch electrode wirings being electrically insulated from each other, the plurality of the first electrodes being electrically insulated from each other, wherein the plurality of the touch electrode wirings and the plurality of the first electrodes are in a one-to-one correspondence;
    forming a first encapsulation structure on a side of the plurality of the first electrodes away from the base substrate, and then using a laser irradiation process to electrically connect respective first electrodes with the touch electrode wirings corresponding thereto by via holes passing through the organic functional layer; and
    after forming the organic functional layer and before forming the plurality of the first electrodes, the method further comprises: forming a plurality of spacers on the organic functional layer, wherein each of the plurality of the spacers has a longitudinal cross-section in a shape of an inverted trapezoid,
    wherein the forming the plurality of the first electrodes comprises: forming a first electrode layer by an evaporation method, wherein the first electrode layer cracks at edges of the plurality of the spacers to form the plurality of the first electrodes being electrically insulated from each other.

2. The preparation method according to claim 1, wherein after forming the plurality of the first electrodes, and before forming the first encapsulation structure, the method further comprises:
    forming a plurality of auxiliary electrodes which are spaced apart from each other on the plurality of the first electrodes, wherein the plurality of the auxiliary electrodes and the plurality of the first electrodes are in a one-to-one correspondence, an orthographic projection of any one of the plurality of the auxiliary electrodes on the base substrate, an orthographic projection of a first electrode of the plurality of the first electrodes corresponding to the any one of the plurality of the auxiliary electrodes on the base substrate, and an orthographic projection of touch electrode wiring corresponding to the any one of the plurality of the auxiliary electrodes on the base substrate have an overlapping region.

3. The preparation method according to claim 2, wherein the auxiliary electrodes are melted by the laser irradiation process and flow into the via holes to electrically connect the first electrodes with the touch electrode wirings corresponding thereto.

4. The preparation method according to claim 1, further comprising: forming a second encapsulation structure on the first encapsulation structure.

5. The preparation method according to claim 4, wherein the second encapsulation structure comprises an inorganic encapsulation layer and an organic encapsulation layer which are sequentially stacked and alternately arranged.

6. The preparation method according to claim 1, wherein the laser irradiation process is used in a non-display region, such that the first electrodes are electrically connected with the touch electrode wirings corresponding thereto by the via holes passing through the organic functional layer.

7. The preparation method according to claim 1, further comprising: sequentially forming a driving circuit, a second electrode and a pixel definition layer on the base substrate, wherein the driving circuit comprises a gate electrode, a first source-drain electrode, and a second source-drain electrode; and the second electrode is electrically connected with the first source-drain electrode or the second source-drain electrode.

8. The preparation method according to claim 7, wherein the plurality of the touch electrode wirings are formed on a side of the pixel definition layer away from the base substrate.

9. The preparation method according to claim 7, wherein the plurality of the touch electrode wirings are formed in a same layer as the gate electrode, or, the plurality of the touch electrode wirings are formed in a same layer as the first source-drain electrode or the second source-drain electrode.

10. An organic light-emitting display panel formed by the preparation method according to claim 1.

* * * * *